(12) United States Patent
Zhou et al.

(10) Patent No.: US 10,497,567 B2
(45) Date of Patent: Dec. 3, 2019

(54) METHOD OF ENHANCED SELECTIVITY OF HARD MASK USING PLASMA TREATMENTS

(71) Applicant: Applied Materials, Inc., Santa Clara, CA (US)

(72) Inventors: Hailong Zhou, San Jose, CA (US); Yangchung Lee, Oakland, CA (US); Chain Lee, Sunnyvale, CA (US); Hui Sun, Santa Clara, CA (US); Jonathan Sungehul Kim, Danville, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days.

(21) Appl. No.: 16/035,994

(22) Filed: Jul. 16, 2018

(65) Prior Publication Data

US 2019/0043723 A1 Feb. 7, 2019

Related U.S. Application Data

(60) Provisional application No. 62/541,986, filed on Aug. 7, 2017.

(51) Int. Cl.
*H01L 21/033* (2006.01)
*H01L 21/3213* (2006.01)
(Continued)

(52) U.S. Cl.
CPC ...... *H01L 21/0338* (2013.01); *H01L 21/0332* (2013.01); *H01L 21/0337* (2013.01); *H01L 21/31116* (2013.01); *H01L 21/31144* (2013.01); *H01L 21/32136* (2013.01); *H01L 21/32139* (2013.01); *H01L 21/67248* (2013.01); *H01L 21/6831* (2013.01); *H01L 21/67069* (2013.01); *H01L 21/67103* (2013.01); *H01L 21/67109* (2013.01); *H01L 29/4966* (2013.01); *H01L 29/517* (2013.01); *H01L 29/518* (2013.01)

(58) Field of Classification Search
CPC ............ H01L 21/0338; H01L 21/0332; H01L 21/32136; H01L 21/0337; H01L 21/30655; H01L 2224/11916
USPC ................ 438/694, 695, 696, 700, 720, 736
See application file for complete search history.

(56) References Cited

U.S. PATENT DOCUMENTS 9,595,451 B1 3/2017 Zhou et al.
2003/0092272 A1* 5/2003 Dutra ................ H01J 37/32477
438/694
(Continued)

*Primary Examiner* — Binh X Tran
(74) *Attorney, Agent, or Firm* — Patterson + Sheridan LLP

(57) ABSTRACT

Implementations described herein generally relate to an etching process for etching materials with high selectivity. In one implementation, a method of etching a gate material to form features in the gate material is provided. The method includes (a) exposing a cobalt mask layer to a fluorine-containing gas mixture in a first mode to form a passivation film on the cobalt mask layer. The cobalt mask layer exposes a portion of a gate material disposed on a substrate. The method further comprises (b) exposing the portion of the gate material to an etching gas mixture in a second mode to etch the portion of the gate material. The portion of the gate material is etched through openings defined in the cobalt mask layer and the portion of the gate material is etched at a greater rate than the cobalt mask layer having the passivation layer disposed thereon.

20 Claims, 4 Drawing Sheets

(51) Int. Cl.
  *H01L 21/67*   (2006.01)
  *H01L 21/311*  (2006.01)
  *H01L 21/683*  (2006.01)
  *H01L 29/49*   (2006.01)
  *H01L 29/51*   (2006.01)

(56) References Cited

U.S. PATENT DOCUMENTS

| | | | |
|---|---|---|---|
| 2011/0132754 A1* | 6/2011 | Shirotori | B82Y 10/00 |
| | | | 204/297.05 |
| 2011/0298062 A1 | 12/2011 | Ganguli et al. | |
| 2015/0017741 A1* | 1/2015 | Fujita | H01L 43/12 |
| | | | 438/3 |
| 2015/0017810 A1* | 1/2015 | Guha | H01L 21/31116 |
| | | | 438/714 |
| 2015/0140812 A1* | 5/2015 | Zope | H01L 21/32115 |
| | | | 438/669 |
| 2016/0314985 A1* | 10/2016 | Yang | H01J 37/32449 |
| 2017/0229308 A1* | 8/2017 | Park | C11D 3/04 |
| 2018/0138085 A1* | 5/2018 | Wang | H01L 21/76877 |

* cited by examiner

METHOD OF ENHANCED SELECTIVITY OF HARD MASK USING PLASMA TREATMENTS

CROSS-REFERENCE TO RELATED APPLICATIONS

This application claims benefit of U.S. Provisional Patent Application Ser. No. 62/541,986 filed Aug. 7, 2017. The aforementioned related patent application is herein incorporated by reference in its entirety.

BACKGROUND

Field

Implementations described herein generally relate to an etching process for etching materials with high selectivity.

Description of the Related Art

CVD copper, PVD copper, ALD copper, and electroplated copper have been used as the interconnect material of choice in recent years. However, with the continued miniaturization of circuit technology, the dimensions of the size and pitch of circuit features such as interconnect and gate structures have placed additional demands on processing capabilities. For example, at the 10 nm Node the effective resistivity of copper is typically in the range of about 6 µOhm-cm. At the 7 nm Node the effective resistivity of copper typically increases to the range of about 6.5 µOhm-cm; and, at the 5 nm Node, the effective resistivity of copper typically increases to the range of about 11.5 µOhm-cm. At the 7 nm Node, and particularly at the 5 nm Node, metals such as cobalt or tungsten become competitive with copper in terms of effective resistivity. For example, both copper and cobalt typically have an effective resistivity in the range of about 12 µOhm-cm at the 5 nm Node, and tungsten typically has an effective resistivity of about 13.5. Thus, cobalt is a promising candidate as circuit features decrease.

Although cobalt is a promising candidate, cobalt also presents additional processing challenges. For example, cobalt is easily oxidized, which reduces it's etch selectivity in relation to other interconnect and gate materials.

Therefore, there is a need in the art for improved methods for etching features with high aspect ratios.

SUMMARY

Implementations described herein generally relate to an etching process for etching materials with high selectivity. In one implementation, a method of etching a gate material to form features in the gate material is provided. The method comprises (a) exposing a cobalt mask layer to a fluorine-containing gas mixture in a first mode to form a passivation layer on the cobalt mask layer. The cobalt mask layer exposes a portion of a gate material disposed on a substrate. The method further comprises (b) exposing the portion of the gate material to an etching gas mixture in a second mode to etch the portion of the gate material. The portion of the gate material is etched through openings defined in the cobalt mask layer and the portion of the gate material is etched at a greater rate than the cobalt mask layer having the passivation layer disposed thereon.

In another implementation, a method of etching a gate material to form features in the gate material is provided. The method comprises (a) exposing a cobalt mask layer to a fluorine-containing gas mixture in a first mode to form a passivation layer on the cobalt mask layer. The cobalt mask layer exposes a portion of a gate material disposed on a substrate. The passivation layer is predominantly formed on a top surface, corners and sidewalls of openings defined in the cobalt mask layer. The method further comprises (b) exposing the portion of the gate material to an etching gas mixture in a second mode to etch the portion of the gate material. The portion of the gate material is etched through the openings defined in the cobalt mask layer. A ratio of a removal rate of the gate material to a removal rate of the cobalt mask layer is 6:1 or greater.

In yet another implementation, a method of etching a gate material to form features in a gate material is provided. The method comprises (a) exposing a cobalt mask layer to a fluorine-containing gas mixture in a first mode to form a passivation layer on the cobalt mask layer. The cobalt mask layer exposes a portion of a gate material disposed on a substrate. The passivation layer is predominantly formed on a top surface, corners and sidewalls of openings defined in the cobalt mask layer. The method further comprises (b) exposing the portion of the gate material to an etching gas mixture in a second mode to etch the portion of the gate material. The portion of the gate material is etched through the openings defined in the cobalt mask layer. A ratio of a removal rate of the gate material to a removal rate of the cobalt mask layer is 6:1 or greater. The method further comprises (c) exposing the passivation layer to the fluorine-containing gas mixture to repair the passivation layer on the cobalt mask layer. The method further comprises (d) exposing the portion of the gate material to the etching gas mixture to etch the portion of the gate material.

BRIEF DESCRIPTION OF THE DRAWINGS

So that the manner in which the above-recited features of the present disclosure can be understood in detail, a more particular description of the implementations, briefly summarized above, may be had by reference to implementations, some of which are illustrated in the appended drawings. It is to be noted, however, that the appended drawings illustrate only typical implementations of this disclosure and are therefore not to be considered limiting of its scope, for the disclosure may admit to other equally effective implementations.

Figure 1:
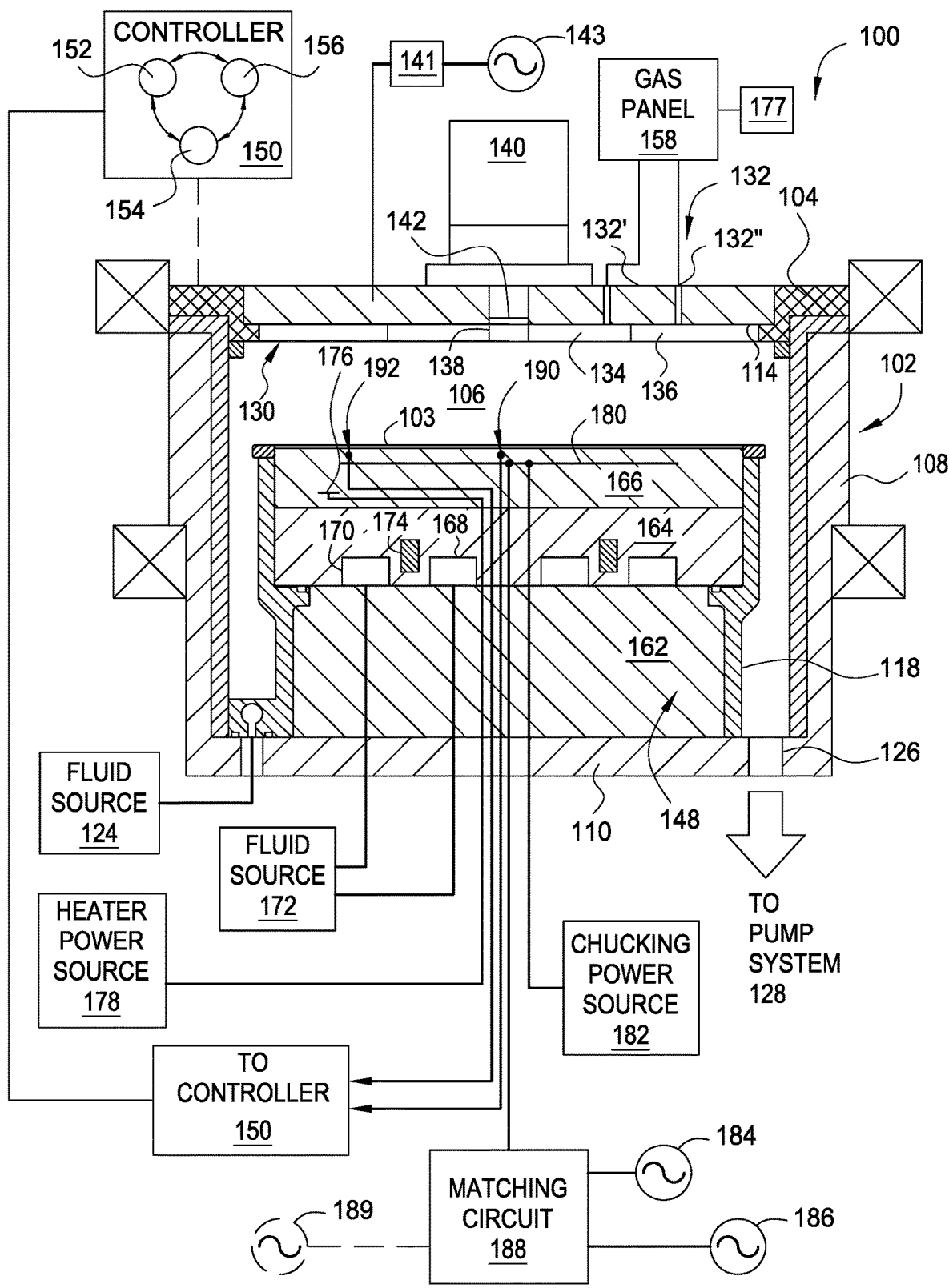
FIG. 1 depicts a schematic illustration of an apparatus that can be used for the practice of implementations described herein.

To facilitate understanding, identical reference numerals have been used, where possible, to designate identical elements that are common to the figures. It is contemplated that elements and features of one implementation may be beneficially incorporated in other implementations without further recitation.

DETAILED DESCRIPTION

The following disclosure describes methods for enhanced etch selectivity. Certain details are set forth in the following description and in FIGS. 1-3E to provide a thorough understanding of various implementations of the disclosure. Other details describing well-known structures and systems often associated with plasma etching are not set forth in the following disclosure to avoid unnecessarily obscuring the description of the various implementations.

Many of the details, dimensions, angles and other features shown in the Figures are merely illustrative of particular implementations. Accordingly, other implementations can have other details, components, dimensions, angles and features without departing from the spirit or scope of the present disclosure. In addition, further implementations of the disclosure can be practiced without several of the details described below.

In semiconductor fabrication, one major role of back-end-of-line (BEOL) is to form interconnects to connect discrete devices to create functional circuits. As device feature size and hence interconnects continue to shrink, there is a growing challenge in preventing degradation of interconnect performance due at least in part to an increase in resistance-capacitance (RC) delay.

Typically, interconnects are formed with copper, using dual damascene processing techniques and copper interconnects are capped by liners, such as a tantalum and/or tantalum nitride liner. One of the major concerns with copper interconnect structures is their high susceptibility to electromigration, which can lead to void formation and device failure. Some processes involve high-k metal gate filling with tungsten, and tungsten may be used to form a metal contact to a source/drain contact. However, tungsten has a high sheet resistance compared to metals such as cobalt, particularly in small features. Small features may have a technology node less than about 10 nm, for example, 7 nm or less, and 5 nm or less. This and other issues have led to interest in the use of other metals as interconnects.

Replacing copper with Co introduces its own processing challenges, including, for example, etching of Co. For example, cobalt is easily oxidized, which reduces the etch selectivity of cobalt in relation to other interconnect and gate materials.

Implementations of the present disclosure provide a highly reliable plasma treatment method for highly selective etching of among other things, cobalt relative to other transistor gate materials in critical feature processing such as sub-ten nanometer gate materials. In some implementations, the method includes supplying a fluorine-containing gas or gas mixture to treat the surface of a mask layer (e.g., cobalt) while forming a passivation layer on the mask layer. The passivation layer formed on the mask layer allows for subsequent selective etching of other exposed gate materials relative to the mask layer.

FIG. 1 is a sectional view of one example of a processing chamber 100 suitable for performing a patterning process to etch a planarization layer along with a mask layer on a substrate using an etching process. Suitable processing chambers that may be adapted for use with the teachings disclosed herein include, for example, a Sym3®, C3® and Mesa™ processing chamber available from Applied Materials, Inc. of Santa Clara, Calif. Although the processing chamber 100 is shown including a plurality of features that enable superior etching performance, it is contemplated that other processing chambers may be adapted to benefit from one or more of the inventive features disclosed herein.

The processing chamber 100 includes a chamber body 102 and a lid 104 which enclose an interior volume 106. The chamber body 102 is typically fabricated from aluminum, stainless steel or other suitable material. The chamber body 102 generally includes sidewall(s) 108 and a bottom 110. A substrate support pedestal access port (not shown) is generally defined in a sidewall 108 and a selectively sealed by a slit valve to facilitate entry and egress of a substrate 103 from the processing chamber 100. An exhaust port 126 is defined in the chamber body 102 and couples the interior volume 106 to a vacuum pump system 128. The vacuum pump system 128 generally includes one or more pumps and throttle valves utilized to evacuate and regulate the pressure of the interior volume 106 of the processing chamber 100. In one implementation, the vacuum pump system 128 maintains the pressure inside the interior volume 106 at operating pressures typically between about 10 mTorr to about 500 Torr.

The lid 104 is sealingly supported on the sidewall 108 of the chamber body 102. The lid 104 may be opened to allow excess to the interior volume 106 of the processing chamber 100. The lid 104 includes a window 142 that facilitates optical process monitoring. In one implementation, the window 142 is comprised of quartz or other suitable material that is transmissive to a signal utilized by an optical monitoring system 140 mounted outside the processing chamber 100.

The optical monitoring system 140 is positioned to view at least one of the interior volume 106 of the chamber body 102 and/or the substrate 103 positioned on a substrate support pedestal assembly 148 through the window 142. In one implementation, the optical monitoring system 140 is coupled to the lid 104 and facilitates an integrated deposition process that uses optical metrology to provide information that enables process adjustment to compensate for incoming substrate pattern feature inconsistencies (such as thickness, and the like), provide process state monitoring (such as plasma monitoring, temperature monitoring, and the like) as needed. One optical monitoring system that may be adapted to benefit from the present disclosure is the EyeD® full-spectrum, interferometric metrology module, available from Applied Materials, Inc., of Santa Clara, Calif.

A gas panel 158 is coupled to the processing chamber 100 to provide process and/or cleaning gases to the interior volume 106. In the example depicted in FIG. 1, inlet ports 132', 132" are provided in the lid 104 to allow gases to be delivered from the gas panel 158 to the interior volume 106 of the processing chamber 100. In one implementation, the gas panel 158 is adapted to provide fluorinated process gas through the inlet ports 132', 132" and into the interior volume 106 of the processing chamber 100. In one implementation, the process gas provided from the gas panel 158 includes at least a fluorinated gas, chlorine, and a carbon-containing gas, a nitrogen-containing gas and a chlorine-containing gas. Examples of fluorinated and- carbon containing gases include $CHF_3$, $CH_2F_2$ and $CF_4$. Other fluorinated gases may include one or more of $C_2F$, $C_4F_6$, $C_3F_8$ and $C_5F_8$. Examples of the nitrogen-containing gas include $N_2$, $NH_3$, and the like. Examples of the chlorine-containing gas include HCl, $Cl_2$, $CCl_4$, $CHCl_3$, $CH_2Cl_2$, $CH_3Cl$, and the like. Suitable examples of the carbon-containing gas include methane ($CH_4$), ethane ($C_2H_6$), ethylene ($C_2H_4$), and the like.

A showerhead (gas distribution) assembly 130 is coupled to an interior surface 114 of the lid 104. The showerhead assembly 130 includes a plurality of apertures that allow the gases flowing through the showerhead assembly 130 from the inlet ports 132', 132" into the interior volume 106 of the processing chamber 100 in a predefined distribution across the surface of the substrate 103 being processed in the processing chamber 100.

A remote plasma source 177 may be optionally coupled to the gas panel 158 to facilitate dissociating gas mixture from a remote plasma prior to entering into the interior volume 106 for processing. A RF source power 143 is coupled through a matching network 141 to the showerhead assembly 130. The RF source power 143 typically is capable of producing up to about 3000 W at a tunable frequency in a range from about 50 kHz to about 200 MHz.

The showerhead assembly 130 additionally includes a region transmissive to an optical metrology signal. The optically transmissive region or passage 138 is suitable for allowing the optical monitoring system 140 to view the interior volume 106 and/or the substrate 103 positioned on the substrate support pedestal assembly 148. The passage 138 may be a material, an aperture or plurality of apertures formed or disposed in the showerhead assembly 130 that is substantially transmissive to the wavelengths of energy generated by, and reflected back to, the optical monitoring system 140. In one implementation, the passage 138 includes a window 142 to prevent gas leakage through the passage 138. The window 142 may be a sapphire plate, quartz plate or other suitable material. The window 142 may alternatively be disposed in the lid 104.

In one implementation, the showerhead assembly 130 is configured with a plurality of zones that allow for separate control of gas flowing into the interior volume 106 of the processing chamber 100. In the example illustrated in FIG. 1, the showerhead assembly 130 as an inner zone 134 and an outer zone 136 that are separately coupled to the gas panel 158 through separate inlet ports 132', 132".

The substrate support pedestal assembly 148 is disposed in the interior volume 106 of the processing chamber 100 below the showerhead assembly 130. The substrate support pedestal assembly 148 holds the substrate 103 during processing. The substrate support pedestal assembly 148 generally includes a plurality of lift pins (not shown) disposed therethrough that are configured to lift the substrate 103 from the substrate support pedestal assembly 148 and facilitate exchange of the substrate 103 with a robot (not shown) in a conventional manner. An inner liner 118 may closely circumscribe the periphery of the substrate support pedestal assembly 148. In one implementation, the liner 118 is fluidly coupled with a fluid source 124 that circulates a temperature regulating fluid therethrough.

In one implementation, the substrate support pedestal assembly 148 includes a mounting plate 162, a base 164 and an electrostatic chuck 166. The mounting plate 162 is coupled to the bottom of the chamber body 102 includes passages for routing utilities, such as fluids, power lines and sensor leads, among others, to the base 164 and the electrostatic chuck 166. The electrostatic chuck 166 comprises at least one electrode 180 (e.g., a clamping electrode) for retaining the substrate 103 below the showerhead assembly 130. The electrostatic chuck 166 is driven by a chucking power source 182 to develop an electrostatic force that holds the substrate 103 to the chuck surface, as is conventionally known. Alternatively, the substrate 103 may be retained to the substrate support pedestal assembly 148 by clamping, vacuum or gravity.

At least one of the base 164 or electrostatic chuck 166 may include at least one optional embedded heater 176, at least one optional embedded isolator 174 and a plurality of conduits 168, 170 to control the lateral temperature profile of the substrate support pedestal assembly 148. The conduits 168, 170 are fluidly coupled to a fluid source 172 that circulates a temperature regulating fluid therethrough. The embedded heater 176 is regulated by a power source 178. The conduits 168, 170 and the embedded heater 176 are utilized to control the temperature of the base 164, thus heating and/or cooling the electrostatic chuck 166 and ultimately, the temperature profile of the substrate 103 disposed thereon. The temperature of the electrostatic chuck 166 and the base 164 may be monitored using a plurality of temperature sensors 190, 192. The electrostatic chuck 166 may further comprise a plurality of gas passages (not shown), such as grooves, that are formed in a substrate support pedestal supporting surface of the electrostatic chuck 166 and fluidly coupled to a source of a heat transfer (or backside) gas, such as He. In operation, the backside gas is provided at controlled pressure into the gas passages to enhance the heat transfer between the electrostatic chuck 166 and the substrate 103.

In one implementation, the substrate support pedestal assembly 148 is configured as a cathode and includes the electrode 180 that is coupled to a plurality of RF bias power sources 184, 186. The RF bias power sources 184, 186 are coupled between the electrode 180 disposed in the substrate support pedestal assembly 148 and another electrode, such as the showerhead assembly 130 or ceiling (lid 104) of the chamber body 102. The RF bias power excites and sustains a plasma discharge formed from the gases disposed in the processing region of the chamber body 102.

In the example depicted in FIG. 1, the dual RF bias power sources 184, 186 are coupled to the electrode 180 disposed in the substrate support pedestal assembly 148 through a matching circuit 188. The signal generated by the RF bias power sources 184, 186 is delivered through matching circuit 188 to the substrate support pedestal assembly 148 through a single feed to ionize the gas mixture provided in the processing chamber 100, thus providing ion energy necessary for performing a deposition or other plasma enhanced process. The RF bias power sources 184, 186 are generally capable of producing an RF signal having a frequency of from about 50 kHz to about 200 MHz and a power between about 0 Watts and about 5000 Watts. An additional bias power source 189 may be coupled to the electrode 180 to control the characteristics of the plasma.

During operation, the substrate 103 is disposed on the substrate support pedestal assembly 148 in the processing chamber 100. A process gas and/or gas mixture is introduced into the chamber body 102 through the showerhead assembly 130 from the gas panel 158. The vacuum pump system 128 maintains the pressure inside the chamber body 102 while removing deposition by-products.

A controller 150 is coupled to the processing chamber 100 to control operation of the processing chamber 100. The controller 150 includes a central processing unit (CPU) 152, a memory 154, and a support circuit 156 utilized to control the process sequence and regulate the gas flows from the gas panel 158. The CPU 152 may be any form of general-purpose computer processor that may be used in an industrial setting. The software routines can be stored in the memory 154, such as random access memory, read only memory, floppy, or hard disk drive, or other form of digital storage. The support circuit 156 is conventionally coupled to the CPU 152 and may include cache, clock circuits, input/output systems, power supplies, and the like. Bi-directional communications between the controller 150 and the various components of the processing chamber 100 are handled through numerous signal cables.

Figure 2:
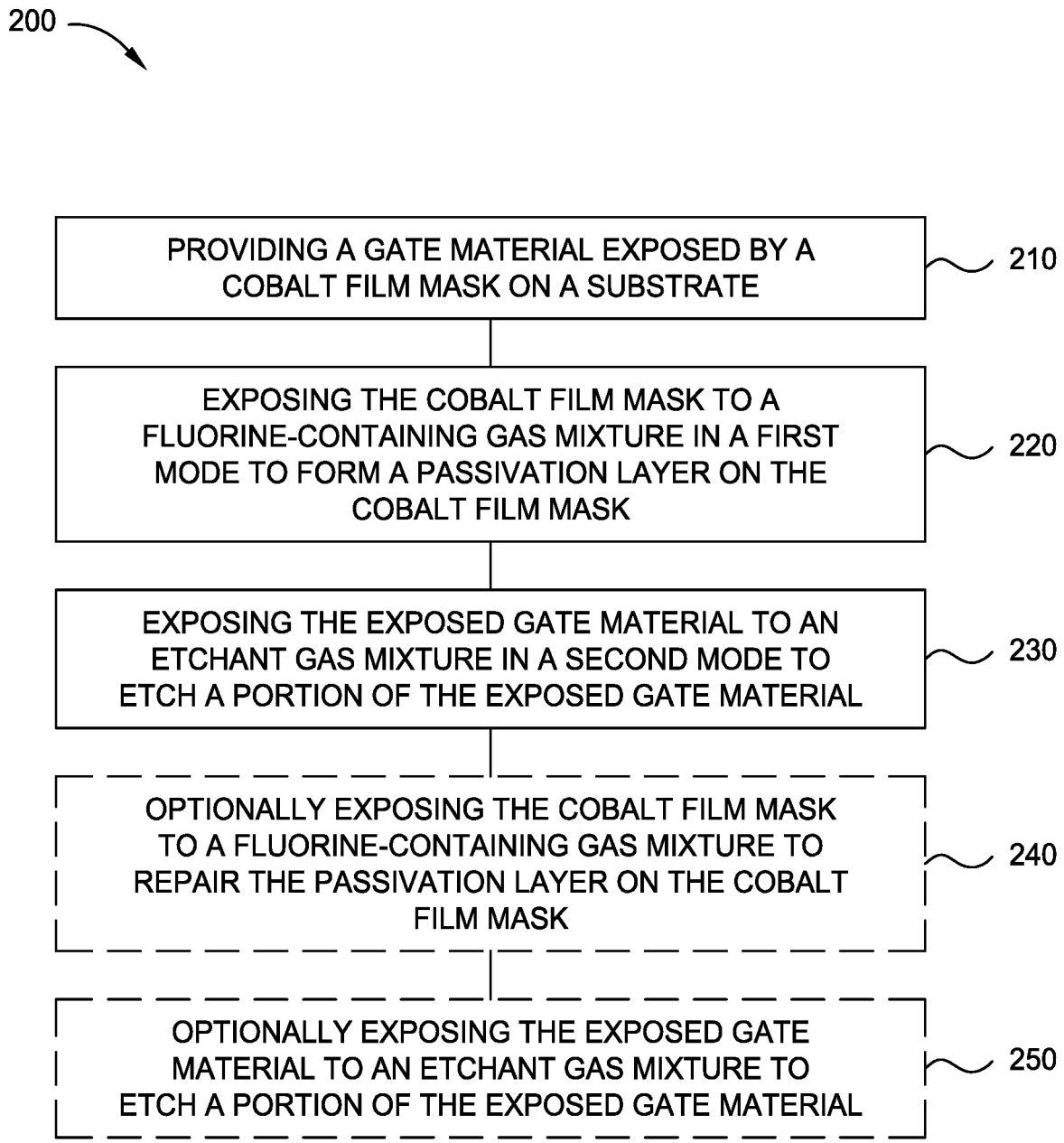
FIG. 2 is a process flow diagram depicting one implementation of a method for etching a gate material disposed on a substrate.

FIG. 2 is a process flow diagram depicting one implementation of a method 200 for etching a gate material disposed on a substrate. FIGS. 3A-3E are schematic side views of a structure formed according to the process flow diagram of FIG. 2. The method 200 may be utilized to form high aspect ratio features, e.g., greater than 100:1, for structures, such as a contact structure, gate structure, NAND structure or interconnection structure for logic or memory devices as needed. Alternatively, the method 200 may be beneficially utilized to etch other types of structures.

The method 200 begins at operation 210 by transferring (i.e., providing) a substrate 310 to an etch process chamber, such as the processing chamber 100 depicted in FIG. 1. In the implementation depicted in FIG. 3A, the substrate 310 has a film stack 312 having a cobalt mask layer 314 and a gate material 316. In some implementations, the cobalt mask layer 314 is patterned. An optional structure 320 (shown by the dotted line 322) may be formed on the substrate 310 when needed. The optional structure 320 may include composite film layers, including pairs of alternating silicon oxide layer and silicon nitride layers (ONON structure) or pairs of alternating silicon oxide layer and polysilicon layers (OPOP structure). It is noted that the optional structure 320 may be any suitable structures, including a single layer, multiple layers or any other configurations as needed.

The cobalt mask layer 314 defines openings 330 that expose a surface 332 of the underlying gate material 316 for etching. The substrate 310 may be any one of semiconductor substrates, silicon wafers, glass substrates and the like. The substrate 310 may be a material such as crystalline silicon (e.g., Si<100> or Si<111>), silicon oxide, strained silicon, silicon germanium, germanium, doped or undoped polysilicon, doped or undoped silicon wafers and patterned or non-patterned wafers silicon on insulator (SOI), carbon doped silicon oxides, silicon nitride, doped silicon, germanium, gallium arsenide, glass, or sapphire. The substrate 310 may have various dimensions, such as 200 mm, 300 mm, 450 mm or other diameter, as well as, being a rectangular or square panel. Unless otherwise noted, examples described herein are conducted on substrates with a 200 mm diameter, a 300 mm diameter, or a 450 mm diameter substrate.

In some implementation, the substrate is patterned. In some implementations, a patterned substrate may include a variety of topography across the substrate. In some implementations, partially fabricated gates may be present on the substrate. For example, a substrate may include a cobalt layer with a hard mask deposited over the cobalt layer. In some implementations, the hard mask may already be patterned. In some implementations, the substrate may also be prepared by partially wet etching the cobalt to form a pattern by which cobalt is partially recessed.

A patterned substrate may have "features" such as vias or contact holes, which may be characterized by one or more of narrow and/or re-entrant openings, constrictions within the features, and high aspect ratios. The features may be formed in one or more of the layers described herein. One example of a feature is a hole or via in a semiconductor substrate or a layer on the substrate. Another example is a trench in a substrate or layer. In various implementations, the feature may have an under-layer, such as a barrier layer or adhesion layer. Non-limiting examples of under-layers include dielectric layers and conducting layers, e.g., silicon oxides, silicon nitrides, silicon carbides, metal oxides, metal nitrides, metal carbides, and metal layers.

In various implementations, types of substrates fabricated from performing the disclosed implementations may depend on the aspect ratio of various features on the substrate prior to performing disclosed implementations. In some implementations, features on a substrate provided in method 200 may have an aspect ratio of at least about 2:1, at least about 4:1, at least about 6:1, at least about 10:1, or higher. The feature may also have a dimension near the opening, e.g., an opening diameter or line width of between about 10 nanometers to 500 nanometers, for example between about 25 nanometers and about 300 nanometers. Disclosed methods may be performed on substrates with features having an opening less than about 150 nanometers. A via, trench or other recessed feature may be referred to as an unfilled feature or a feature. According to various implementations, the feature profile may narrow gradually and/or include an overhang at the feature opening. A re-entrant profile is one that narrows from the bottom, closed end, or interior of the feature to the feature opening. A re-entrant profile may be generated by asymmetric etching kinetics during patterning and/or the overhang due to non-conformal film step coverage in the previous film deposition, such as deposition of a diffusion barrier. In various examples, the feature may have a width smaller in the opening at the top of the feature than the width of the bottom of the feature. Features as described herein may be on a substrate to be etched per disclosed implementations such as described herein with respect to FIG. 2.

In one implementation, the cobalt mask layer 314 may function as a hard mask. The cobalt mask layer 314 is used as an etch mask to etch features in the gate material 316 with desired aspect ratios. The features described herein may include trenches, vias, openings and the like.

The gate material 316 may include dielectric materials, high-k materials, metal-containing materials, or combinations thereof. Suitable examples of dielectric materials include undoped silicon glass (USG), such as silicon oxide or TEOS, boron-silicate glass (BSG), phosphorus-silicate glass (PSG), boron-phosphorus-silicate glass (BPSG), high-k material, low dielectric constant insulating materials (e.g., dielectric constants less than about 4.0) or combinations thereof. Examples of low dielectric constant insulating materials include silicate glass, fluorosilicate glass (FSG), and carbon doped silicon oxide (SiOC), silicon carbide (SiC) and nitrogen containing silicon carbide (SiCN), among others. Suitable examples of the high-k material layer include hafnium dioxide ($HfO_2$), zirconium dioxide ($ZrO_2$), hafnium silicon oxide ($HfSiO_2$), hafnium aluminum oxide (HfAlO), zirconium silicon oxide ($ZrSiO_2$), tantalum dioxide ($TaO_2$), aluminum oxide, aluminum doped hafnium dioxide, bismuth strontium titanium (BST), and platinum zirconium titanium (PZT), among others. Suitable examples of the metal-containing material layer include Ti, Ta, W, Al, TiN, TaN, TaSiAlC, WC, AlN, and the like. In one implementation, the gate material 316 has a thickness between about 3000 Å to about 15000 Å, such as between about 4000 Å to about 12000 Å, for example about 10000 Å.

Figure 3A:
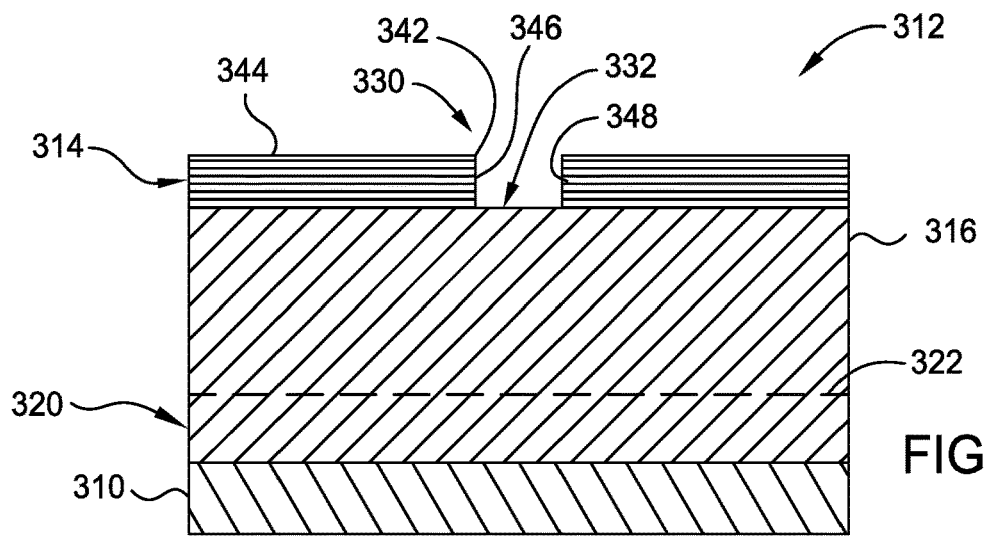
FIGS. 3A-3E are schematic side views of a structure formed according to the process flow diagram of FIG. 2.
Figure 3B:
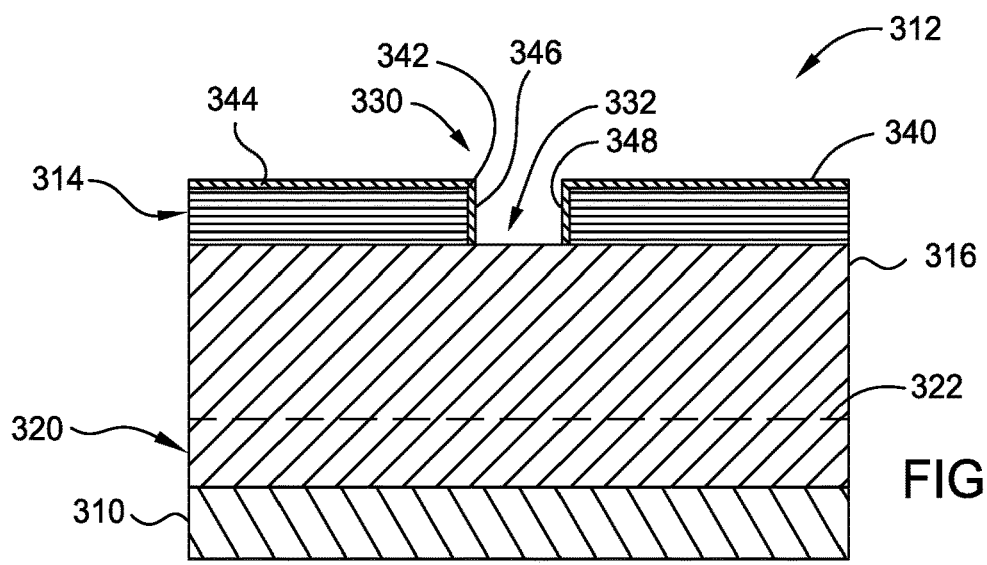

In the implementation depicted in FIG. 3A, the gate material 316 is a combination of dielectric materials, high-k materials, and metal-containing materials having a thickness between about 10 nm and about 10,000 nm. The cobalt mask layer 314 is a cobalt layer.

At operation 220, the cobalt mask layer 314 is exposed to a fluorine-containing gas mixture in a first mode to form a passivation layer 340 on the cobalt mask layer 314. The first mode of the etching process is a plasma treatment process performed to form the passivation layer 340 at certain portions, such as corners 342, top surface 344 and sidewalls 346, 348 of the cobalt mask layer 314. The passivation layer 340 may be dominantly formed on the top surface 344, the corners 342 of the cobalt mask layer 314, and sidewalls 346, 348. In some implementations, the cobalt mask layer 314 is exposed to the fluorine-containing gas mixture and an activation source, such as a plasma to form the passivation layer 340.

The plasma may be an in-situ or remote plasma. In some implementations, the plasma is an inductively coupled plasma. In some implementations, the plasma is a capacitively coupled plasma. The plasma may be generated using a power between about 100 W and about 1500 W. In some implementations, a low bias is applied during operation 220. In some implementations, operation 220 is a bias-free plasma process. In some implementations, alternative activation sources other than plasma may be used. Activation sources such as plasma, reactive ion etching, or ion beam etching may be used instead of plasma to activate the fluorine-containing gas mixture to form an activated fluorine-containing gas mixture to react with the cobalt mask layer 314.

In one example, the first mode of the etching process may be performed by supplying a fluorine-containing gas mixture including a fluorine-containing gas. Suitable examples of the fluorine-containing gas include $CHF_3$, $CH_2F_2$, $CF_4$, $C_2F$, $C_4F_6$, $C_3F_8$, $C_4F_8$, $CHF_3$, $C_2F_6$, $SF_6$, $NF_3$, and the like. The fluorine-containing gas mixture is typically an oxidizer-free gas mixture (e.g., does not contain oxygen or oxygen-containing gases). In one particular example, the fluorine-containing gas is $CHF_3$.

While supplying the fluorine-containing gas mixture into the processing chamber, an inert gas may be optionally supplied into the fluorine-containing gas mixture to assist the profile control as needed. Examples of the inert gas supplied in the gas mixture include $N_2$, Ar, He, Ne, Kr, Xe or the like. In one particular example, the inert gases supplied into the fluorine-containing gas mixture include helium and nitrogen.

During the first mode of the etching process at operation 210, the etching process may be performed in an etching reactor, such as the processing chamber 100 depicted in FIG. 1. While performing the first mode of the etching process in the processing chamber 100, the chamber pressure of the fluorine-containing gas mixture is also regulated. In one exemplary implementation, a process pressure in the processing chamber is regulated between about 2 mTorr to about 100 mTorr, for example, at about 5 mTorr to about 20 Torr. RF source power may be applied to maintain a plasma formed from the first mode of the fluorine-containing gas mixture. For example, a RF source power with a frequency of about 13.56 MHz may be applied at an energy level of between about 200 Watts to about 1000 Watts, such as about 500 Watts, to an inductively coupled antenna source to maintain a plasma inside the etch chamber. A substrate temperature may be maintained between about −10 degrees Celsius to about 100 degrees Celsius, such as about 80 degrees Celsius.

In one implementation of the first mode, the fluorine-containing gas, (e.g., $CHF_3$), may be supplied at a rate between about 10 sccm to about 500 sccm, such as between about 80 sccm and about 100 sccm. The first inert gas, (e.g., He), may be supplied at a flow rate between about 50 sccm and about 200 sccm, such as between about 100 sccm and about 150 sccm. The second inert gas, (e.g., $N_2$), may be supplied at a flow rate between about 50 sccm and about 200 sccm, such as between about 100 sccm and about 150 sccm.

Alternatively, the fluorine-containing gas, (e.g., $CHF_3$ gas) and first inert gas (e.g., He) may be supplied in the first mode at a flow ratio (i.e., $CHF_3$:He) by volume of between about 1:1 and about 1:10, such as between about 1:2 and about 1:5. The fluorine-containing gas, (e.g., $CHF_3$ gas) and second inert gas (e.g., $N_2$) may be supplied at a flow ratio (i.e., $CHF_3$:$N_2$) by volume of between about 1:1 and about 1:10, such as between about 1:2 and about 1:5.

In some implementations, the passivation layer 340 formed on the cobalt mask layer 314 is deposited to a thickness between about 1 nanometer and about 20 nanometers. In some implementations, the passivation layer 340 is deposited to a thickness between about 2 nanometers and about 10 nanometers. In some implementations, the passivation layer 340 is a cobalt fluoride layer.

After operation 220 is completed, an optional chamber purge process may be performed to remove any remaining gases and by-products from the chamber from the passivation layer formation process. During the chamber purge process, a purge gas (e.g., argon gas) may be delivered into the processing chamber 100 from the gas panel and/or from other inlet ports or tubes disposed in the chamber body 102. The purge gas enters the processing chamber 100 and flows through the interior volume 106 and into the exhaust port 126 where it exits the chamber. Pressure within the processing chamber 100 may be controlled using a valve system, which controls the rate at which the exhaust gases are drawn from the exhaust port 126.

Optionally, prior to operation 230, the pressure in the interior volume is stabilized for a predefined RF-on delay time-period. The predefined RF-on delay time-period is a fixed time delay defined as the time-period between introduction of the etching gas mixture into the interior volume and striking or generating the plasma. Any suitable fixed time delay may be used to achieve desired conditions. The RF-on delay time-period may be performed simultaneously, sequentially or may partially overlap with the processes of operation 220 and operation 230.

Figure 3C:
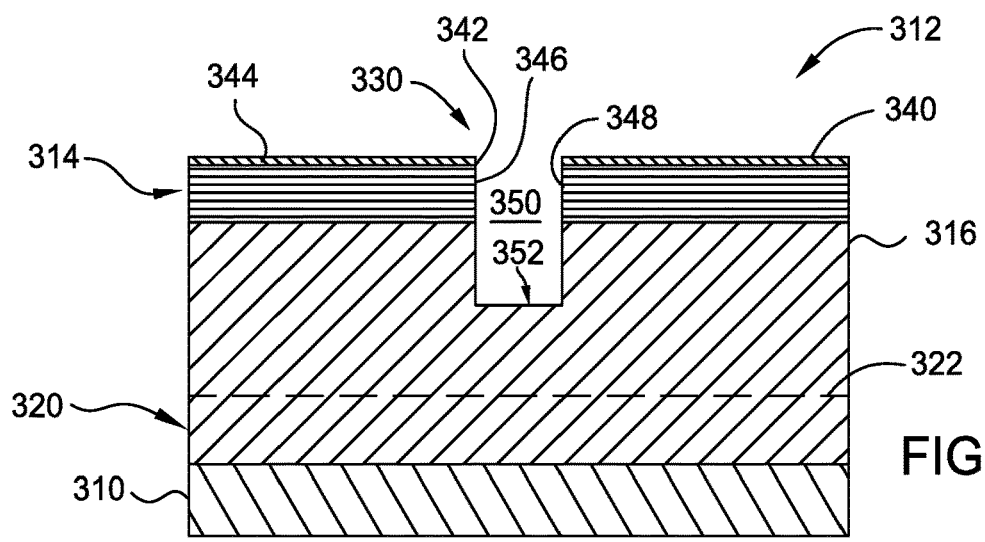

At operation 230, the exposed surface 332 of the gate material 316 is exposed to an etching gas mixture at a second mode to etch the gate material 316 from the exposed surface 332 (shown in FIG. 3B), forming feature(s) 350 with a bottom surface 352 exposed in the feature(s) 350, as shown in FIG. 3C. It is believed that with controlled trajectory and directionality of the ions from the plasma generated during the second mode of the etching process, a controlled etching behavior may be obtained to efficiently etch the gate material 316 in a manner that would yield a desired resultant film profile. As a result of the presence of the passivation layer 340 the active etching species from the plasma may selectively etch only certain portion, e.g., exposed bottom surface 352 of the gate material 316 without significantly attacking, eroding or damaging other portions, e.g., the corners 342, the top surface 344 and the sidewalls 346, 348 of the cobalt mask layer 314. In some implementations, the cobalt mask layer 314 is exposed to the etching gas mixture and an activation source, such as a plasma to form the passivation layer 340.

The plasma may be an in-situ or remote plasma. In some implementations, the plasma is an inductively coupled plasma. In some implementations, the plasma is a capacitively coupled plasma. The plasma may be generated using a power between about 100 W and about 1500 W. In some implementations, a bias is also applied during operation 230. The bias may be generated using a power between about 100 W and about 1500 W. In some implementations, alternative activation sources other than plasma may be used. Activation sources such as plasma, reactive ion etching, or ion beam etching may be used instead of plasma to activate the etching gas mixture to form an activated etching mixture to react with the exposed gate material 316.

However, as the etching process progresses, the likelihood of damage to the corners 342, top surface 344 and the sidewalls 346, 348 of the cobalt mask layer 314 increases. For example, the thickness of the passivation layer 340 at the corner 342 of the cobalt mask layer 314 may become thinner than the thickness of the passivation layer 340 on the sidewalls 346, 348 as the etching process progresses (e.g., the passivation layer 340 formed on the sidewalls 346, 348 is thicker than the passivation layer 340 remaining on the corners 342), resulting in early collapse or deformation of the cobalt mask layer 314. Early collapse or deformation of the cobalt mask layer 314 may result in incomplete profile or structure transfer to the feature(s) 350 formed in the gate material 316, and eventually leading to device failure. Thus, an optional passivation layer repair process may be performed at operation 240, which will be described later below, continuing etching of the feature(s) 350 in the gate material 316 without early deformation or collapse of the cobalt mask layer 314.

In one example, the second mode of the etching process may be performed by supplying an etching gas mixture including a halogen-containing gas. The etching gas mixture may further comprise a silicon-containing gas and/or a carbon-containing gas. The halogen-containing gas that may be supplied in the gas mixture may be a fluorine-containing gas, a chlorine-containing gas, or a bromide-containing gas. Suitable examples of the halogen-containing gas include $CHF_3$, $CH_2F_2$, $CF_4$, $C_2F$, $C_4F_6$, $C_3F_8$, HCl, $C_4F_8$, $Cl_2$, $CCl_4$, $CHCl_3$, $CHF_3$, $C_2F_6$, $CH_2Cl_2$, $CH_3Cl$, $SF_6$, $SiCl_4$, $Si_2Cl_6$, $BCl_3$, $NF_3$, HBr, $Br_2$ and the like. Particularly, examples of the chlorine-containing gas include HCl, $Cl_2$, $CCl_4$, $CHCl_3$, $CH_2Cl_2$, $CH_3Cl$, $SiCl_4$, $Si_2Cl_6$, and the like, and examples of the bromide-containing gas include HBr, $Br_2$ and the like. Suitable examples of the silicon-containing gas include $SiCl_4$, $Si_2Cl_6$, $SiH_4$, $Si_2H_6$, and the like. In one particular example, the halogen containing gas used in the etching gas mixture includes $Cl_2$ and $BCl_3$, the silicon containing gas used in the etching gas mixture includes $SiCl_4$ and the carbon-containing gas is $CH_4$.

While supplying the etching gas mixture into the processing chamber, an inert gas may be optionally supplied into the etching gas mixture to assist the profile control as needed. Examples of the inert gas supplied in the gas mixture include Ar, He, Ne, Kr, Xe or the like.

The second mode of the etching process may be continuously performed until the passivation layer 340 formed on the cobalt mask layer 314 is substantially consumed and needs to be replenished for further etching.

During the second mode of the etching process at operation 230, the etching process may be performed in an etching reactor, such as the processing chamber 100 depicted in FIG. 1. While performing the second mode of the etching process in the processing chamber 100, the chamber pressure of the etching gas mixture is also regulated. In one exemplary implementation, a process pressure in the processing chamber is regulated between about 2 mTorr to about 100 mTorr, for example, between about 5 mTorr and 20 Torr. RF source power may be applied to maintain a plasma formed from the second mode of the etching gas mixture. For example, a RF source power with a frequency of about 13.56 MHz may be applied at an energy level of between about 200 Watts to about 1000 Watts, such as about 500 Watts, to an inductively coupled antenna source to maintain a plasma inside the etch chamber. In addition, during the second mode, a RF bias power, with a frequency of between about 2 MHz and about 13.56 MHz, may be applied less than 500 Watts, such as between about 100 Watts to about 250 Watts, such as about 150 Watts. A substrate temperature may be maintained between about −10 degrees Celsius to about 100 degrees Celsius, such as about 80 degrees Celsius.

In one example of the second mode, a first chlorine-containing gas (e.g., $Cl_2$) may be supplied into the chamber at a rate between about 25 sccm to about 200 sccm, such as between about 50 sccm and about 100 sccm. A second chlorine-containing gas (e.g., $BCl_3$) may be supplied into the chamber at a rate between about 10 sccm to about 200 sccm, such as between about 30 sccm and about 50 sccm. The carbon-containing gas, (e.g., $CH_4$), may be supplied at a flow rate between about 5 sccm and about 50 sccm, such as between about 10 sccm and about 30 sccm. The silicon-containing gas, $SiCl_4$, may be supplied at a flow rate between about 10 sccm and about 100 sccm, such as between about 20 sccm and about 40 sccm. An inert gas, (e.g., He), may be supplied at a flow rate between about 50 sccm and about 500 sccm, such as between about 350 sccm and about 450 sccm.

In one example, between about 1% and about 10% of the gate material 316 is etched away in the second mode of the etching process at operation 230. The second mode of the etching process at operation 230 may be performed for a time period between about 10 seconds and about 40 seconds. The second mode of the etching process may be continuously performed until the feature(s) 350 achieves a desired shape and/or the passivation layer 340 is substantially consumed and needs to be replenished for further etching.

After operation 230 is completed, an optional chamber purge process may be performed to remove any remaining etching gases and by-products remaining in the chamber from the etching process. During the chamber purge process, a purge gas (e.g., argon gas) may be delivered into the processing chamber 100 from the gas panel and/or from other inlet ports or tubes disposed in the chamber body 102. The purge gas enters the processing chamber 100 and flows through the interior volume 106 and into the exhaust port 126 where it exits the chamber. Pressure within the processing chamber 100 may be controlled using a valve system, which controls the rate at which the exhaust gases are drawn from the exhaust port 126.

Optionally, prior to operation 240, the pressure in the interior volume is stabilized for a predefined RF-on delay time-period. The predefined RF-on delay time-period is a fixed time delay defined as the time-period between introduction of the fluorine-containing gas mixture into the interior volume and striking or generating the plasma. Any suitable fixed time delay may be used to achieve desired conditions. The RF-on delay time-period may be performed simultaneously, sequentially or may partially overlap with the processes of operation 230 and operation 240.

Figure 3D:
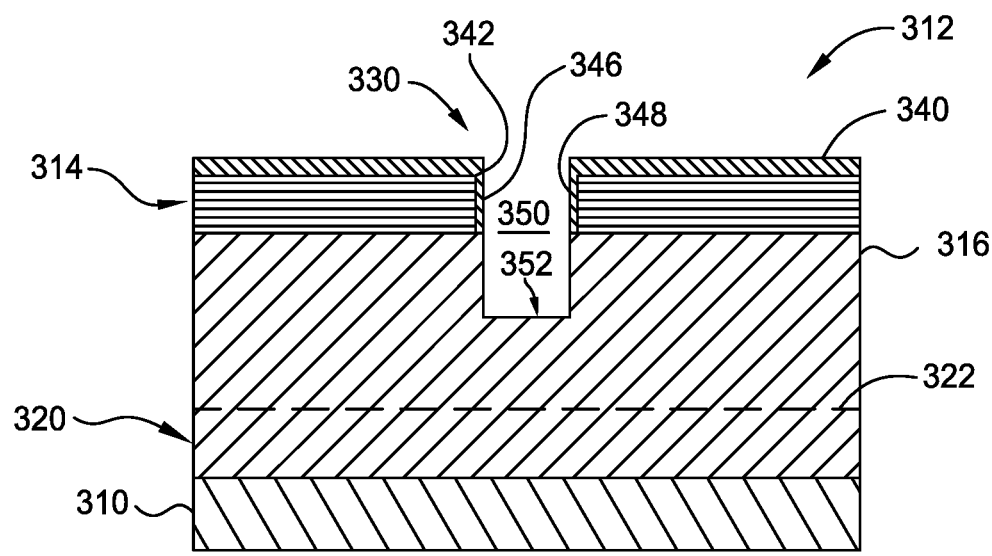

Optionally, at operation 240, the cobalt mask layer 314 is exposed to a fluorine-containing gas mixture to repair the passivation layer 340 on the cobalt mask layer 314. During operation 240, the passivation layer 340 may become damaged, thinned or consumed. For example, as depicted in FIG. 3C, the thickness of the passivation layer 340 at the corners 342 of the cobalt mask layer 314 may become thinner than the thickness of the passivation layer 340 on the sidewalls 346, 348 as the etching process progresses (e.g., the passivation layer 340 formed on the sidewalls 346, 348 is thicker than the passivation layer 340 remaining on the corners 342), resulting in early collapse or deformation of the cobalt mask layer 314. The repair process of operation 240 may be performed using gases and process conditions similar to operation 220. As depicted in FIG. 3D, the repaired passivation layer 340 is thicker than the thinned/damaged passivation layer 340 depicted in FIG. 3C.

After operation 240 is completed, an optional chamber purge process may be performed to remove any remaining etching gases and by-products from the etching process. During the chamber purge process, a purge gas (e.g., argon gas) may be delivered into the processing chamber 100 from the gas panel and/or from other inlet ports or tubes disposed in the chamber body 102. The purge gas enters the processing chamber 100 and flows through the interior volume 106 and into the exhaust port 126 where it exits the chamber. Pressure within the processing chamber 100 may be controlled using a valve system, which controls the rate at which the exhaust gases are drawn from the exhaust port 126.

Optionally, prior to operation 250, the pressure in the interior volume is stabilized for a predefined RF-on delay time-period. The predefined RF-on delay time-period is a fixed time delay defined as the time-period between introduction of the etching gas mixture into the interior volume and striking or generating the plasma. Any suitable fixed time delay may be used to achieve desired conditions. The RF-on delay time-period may be performed simultaneously, sequentially or may partially overlap with the processes of operation 240 and operation 250.

Figure 3E:
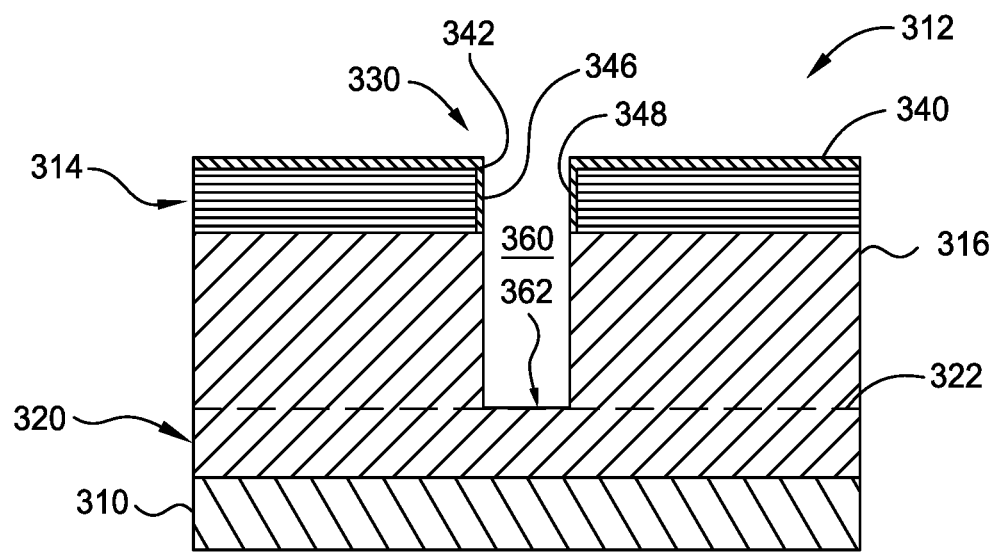

Optionally, at operation 250, the exposed bottom surface 352 of the gate material 316 is exposed to an etching gas mixture to etch the gate material 316 from the exposed bottom surface 352 (shown in FIG. 3D), forming a feature 360 with a bottom surface 362 exposed in the feature 360, as shown in FIG. 3E. The etching process may be performed similarly to the etching process of operation 230.

It is noted that operation 240 and 250 may be repeatedly performed or cycled in a cycle of passivation layer repair followed by etching of the gate material to achieve a desired etch depth.

By utilizing simultaneous passivation/etching, the features 338 with high aspect ratio between about 2:1 and about 80:1, such as greater than 10:1, may be etched and shaped in a controlled manner that can provide the desired profile with the desired substantially sharp right angle and upright (e.g., straight, vertical) sidewalls with steep slope and accurate dimensions.

Thus, implementations of etching a gate material to form features with desired edge/corner profile and desired aspect ratios are provided. By utilizing a passivation mode and an etching mode along the etching process, a controlled ion trajectory/directionality as well as sidewall/corner passivation protection may be obtained so as to etch the dielectric layer in a desired manner that yields features in the dielectric layer with desired accurate and right angle corners and vertical sidewall profile as well as feature aspect ratios. In addition, the passivation and etching processes may be performed in a single chamber without breaking vacuum, which reduces system complexity.

When introducing elements of the present disclosure or exemplary aspects or implementation(s) thereof, the articles "a," "an," "the" and "said" are intended to mean that there are one or more of the elements.

The terms "comprising," "including" and "having" are intended to be inclusive and mean that there may be additional elements other than the listed elements.

While the foregoing is directed to implementations of the present disclosure, other and further implementations of the disclosure may be devised without departing from the basic scope thereof, and the scope thereof is determined by the claims that follow.

The invention claimed is:

1. A method of etching a gate material, comprising:
    (a) exposing a cobalt mask layer to a fluorine-containing gas mixture in a first mode to form a passivation layer on the cobalt mask layer, wherein the cobalt mask layer exposes a portion of a gate material disposed on a substrate; and
    (b) exposing the portion of the gate material to an etching gas mixture in a second mode to etch the portion of the gate material, wherein the portion of the gate material is etched through openings defined in the cobalt mask layer and the portion of the gate material is etched at a greater rate than the cobalt mask layer having the passivation layer disposed thereon.

2. The method of claim 1, wherein process (a) further comprises simultaneously etching the gate material.

3. The method of claim 1, wherein the gate material includes at least one of: $HfO_2$, TiN, TaN, TaSiAlC, WC, or AlN.

4. The method of claim 1, wherein the passivation layer is formed from cobalt fluoride.

5. The method of claim 1, further comprising:
    (c) exposing the passivation layer to the fluorine-containing gas mixture to repair the passivation layer on the cobalt mask layer; and
    (d) exposing the portion of the gate material to the etching gas mixture to etch the portion of the gate material.

6. The method of claim 5, further comprising:
    repeatedly performing (c) and (d) to form features in the gate material.

7. The method of claim 1, wherein the fluorine-containing gas mixture is selected from $CHF_3$, $CH_2F_2$, $CF_4$, $C_2F$, $C_4F_6$, $C_3F_8$, $C_5F_8$, or combinations thereof.

8. The method of claim 7, wherein the fluorine-containing gas mixture is an oxidizer-free gas mixture.

9. The method of claim 1, wherein a first RF source power energizes the fluorine-containing gas mixture during the first mode to form a plasma from the fluorine-containing gas mixture.

10. The method of claim 9, wherein a second RF source power and an RF bias power energize the etching gas mixture during the second mode to form a plasma of the etching gas mixture.

11. The method of claim 1, wherein the etching gas mixture includes a chlorine-containing gas.

12. The method of claim 11, wherein the etching gas mixture further comprises a silicon-containing gas.

13. The method of claim 12, wherein the etching gas mixture further comprises a carbon-containing gas.

14. The method of claim 13, wherein the silicon-containing gas is $SiCl_4$, the chlorine-containing gas includes at least one of $Cl_2$ and $BCl_3$, and the carbon-containing gas is $CH_4$.

15. A method of etching a gate material, comprising:
    (a) exposing a cobalt mask layer to a fluorine-containing gas mixture in a first mode to form a passivation layer on the cobalt mask layer, wherein the cobalt mask layer exposes a portion of a gate material disposed on a substrate and the passivation layer is predominantly formed on a top surface, corners, and sidewalls of openings defined in the cobalt mask layer; and
    (b) exposing the portion of the gate material to an etching gas mixture in a second mode to etch the portion of the gate material, wherein the portion of the gate material is etched through the openings defined in the cobalt mask layer and a ratio of a removal rate of the gate material to a removal rate of the cobalt mask layer is 6:1 or greater.

16. The method of claim 15, wherein a first RF source power energizes the fluorine-containing gas mixture during the first mode to form a plasma from the fluorine-containing gas mixture.

17. The method of claim 16, wherein a second RF source power and an RF bias power energize the etching gas mixture during the second mode to form a plasma of the etching gas mixture.

18. The method of claim 17, wherein the fluorine-containing gas mixture includes $CHF_3$.

19. The method of claim 18, wherein the etching gas mixture comprises $SiCl_4$, at least one of $Cl_2$, and $BCl_3$, and $CH_4$.

20. A method of etching a gate material, comprising:
(a) exposing a cobalt mask layer to a fluorine-containing gas mixture in a first mode to form a passivation layer on the cobalt mask layer, wherein the cobalt mask layer exposes a portion of a gate material disposed on a substrate and the passivation layer is predominantly formed on a top surface, corners and sidewalls of openings defined in the cobalt mask layer;
(b) exposing the portion of the gate material to an etching gas mixture in a second mode to etch the portion of the gate material, wherein the portion of the gate material is etched through the openings defined in the cobalt mask layer and a ratio of a removal rate of the gate material to a removal rate of the cobalt mask layer is 6:1 or greater;
(c) exposing the passivation layer to the fluorine-containing gas mixture to repair the passivation layer on the cobalt mask layer; and
(d) exposing the portion of the gate material to the etching gas mixture to etch the portion of the gate material.

* * * * *